United States Patent [19]
Chantry et al.

[11] Patent Number: 5,852,386
[45] Date of Patent: Dec. 22, 1998

[54] APPARATUS AND METHOD FOR MICROWAVE FIELD STRENGTH STABILIZATION IN CELL TYPE ATOMIC CLOCKS

[75] Inventors: Peter J. Chantry; Carlo F. Petronio, both of Pittsburgh, Pa.

[73] Assignee: Northrop Grumman Corporation, Los Angeles, Calif.

[21] Appl. No.: 867,309

[22] Filed: Jun. 2, 1997

[51] Int. Cl.[6] ...................................................... H03L 7/26
[52] U.S. Cl. ................................................ 331/94.1; 331/3
[58] Field of Search ............................... 331/3, 94.1, 175; 372/32; 324/304

[56] References Cited

U.S. PATENT DOCUMENTS

| | | | |
|---|---|---|---|
| 5,192,921 | 3/1993 | Chantry et al. | 331/3 |
| 5,442,326 | 8/1995 | Liberman | 331/94.1 |
| 5,606,291 | 2/1997 | Verbanets | 331/3 |

*Primary Examiner*—Arnold Kinkead
*Attorney, Agent, or Firm*—Walter G. Sutcliff

[57] ABSTRACT

The microwave field intensity of a cell type atomic clock is stabilized through time division feedback control of the power of the microwave signal implemented by a microcontroller. The depth of the microwave dip is calculated from differences in measurements of the optical signal when the microwave signal is dithered around the atomic transition frequency of the active medium, and measurements taken when the optical signal is dithered around the optical wavelength of the active medium while the microwave signal is adjusted to produce no microwave absorption, either by reducing the microwave power to zero or by detuning it from the atomic transition frequency of the active medium. RF synthesizers suitable for regulating microwave power include a synthesizer using a step recovery diode for frequency multiplication and having the power to a driver amplifier or the bias applied to the diode regulated. A digital synthesizer can also be used to generate a regulated microwave signal.

24 Claims, 6 Drawing Sheets

APPARATUS AND METHOD FOR MICROWAVE FIELD STRENGTH STABILIZATION IN CELL TYPE ATOMIC CLOCKS

BACKGROUND OF THE INVENTION

1. Field of the Invention

This invention relates to cell type atomic clocks, and more particularly, to an apparatus and a method for stabilizing such clocks by regulation of the power of the microwave signal tuned to the atomic transition frequency of the active medium.

2. Background information

Cell type atomic clocks operate by simultaneously irradiating an active medium with optical power and microwave power. The optical power pumps the active atoms, usually Rubidium or Cesium, in order to make the medium absorbing at the microwave frequency corresponding to transitions between the two hyperfine levels of the ground state.

There is a trend to reduce the size and power requirements of cell type atomic clocks which would significantly expand their usefulness. U.S. Pat. No. 5,192,921 discloses a miniature cell type atomic clock. U.S. Pat. No. 5,606,291 discloses such a miniature cell type atomic clock controlled by a digital processor in the form of a microcontroller. The microcontroller stabilizes the microwave frequency by repetitively dithering the microwave frequency around the atomic transition frequency of the medium. In addition, the optical signal is also stabilized by dithering around the optical wavelength of the medium. The microprocessor also regulates the temperature of the medium, the temperature of the laser diode light source, and the generation of the required magnetic field. It is also known that the stability of the cell type atomic clock is sensitive to the intensity of the microwave field used to probe the active medium. Typically the approach has been to stabilize the microwave power applied to the microwave cavity. However, this is only satisfactory if the coupling between the cavity and the cell and the cavity resonance remain constant. Environmental changes, especially changes in temperature, can disturb these parameters.

There is a need, therefore, for a method and apparatus for improving the stability of cell type atomic clocks.

More particularly, there is a need for such a method and apparatus for stabilizing the microwave field which probes the active medium.

There is a specific need for such a method and apparatus which can stabilize the microwave field intensity in a cell type atomic clock which is controlled by a microcontroller.

SUMMARY OF THE INVENTION

These needs and others are satisfied by the invention which is directed to stabilizing the cell type atomic clock by regulating the depth of the "dip" in the optical signal transmitted through the cell caused by the tuned microwave field. With the clock controlled by a microprocessor, time division multiplexing is used to sequentially stabilize the necessary parameters, with the sequence of tasks being repeated indefinitely. This provides the opportunity to monitor the microwave field intensity by detuning the microwave power, or reducing it to zero, during part of the cycle, and measuring the resulting increase in the optical signal. This increase is a measure of the depth of the microwave absorption dip. Feedback control of the microwave power is then used to maintain this measure of the dip constant, thereby ensuring that the field strength applied to the cell during the "on" time is kept constant.

Thus the invention is directed to stabilizing the microwave field intensity of a cell type atomic clock by passing an optical signal through the active medium contained in the cell to optically pump the atoms, applying a microwave signal at frequencies which include an atomic transition frequency of the active medium to a resonator to generate a microwave field coupled to the active medium, measuring the amplitude of the microwave dip in the optical signal passed through the active medium resulting from absorption of the microwave signal by the active medium, and controlling the intensity of the microwave field by regulating the microwave dip relative to a base level.

More particularly, with the atomic clock controlled by a microcontroller, the method includes dithering the microwave signal generating the microwave field coupled to the active medium around a frequency which produces a maximum absorption of the microwave signal by the active medium during a first interval and generating first measurement of the optical signal during the first interval. During a second interval, the microwave signal is adjusted so that there is substantially no absorption of the microwave signal by the active medium and the optical signal is dithered. Second measurements of the optical signal passed through the active medium are generated during the second interval. These steps are sequentially repeated and the power of the microwave signal is controlled to maintain a specified relationship between the first and second measurements which are repeated sequentially.

In one embodiment of the invention, the microwave signal is adjusted during the second interval by reducing the power of the microwave signal substantially to zero. Alternatively, the microwave signal is adjusted by adjusting the frequency to a frequency at which there is substantially no absorption of the microwave signal during the second interval. In the second case, the frequency of the microwave signal is increased and then decreased on alternate second intervals in equal amounts from the frequency which produces maximum absorption.

The invention is also directed to a cell type atomic clock in which the field intensity is stabilized by regulating the depth of the microwave dip. Such apparatus includes in addition to the cell containing the active medium, optical pumping means generating the optical signal which is passed through the cell to optically pump the active medium, microwave means generating the microwave signal, means coupling the microwave signal to the active medium and means measuring the optical signal passing through the active medium, control means including microwave frequency control means controlling the microwave signal generating means to adjust the microwave signal to produce the microwave dip, means calculating the microwave dip, and means controlling the microwave signal generating means to adjust the power of the microwave signal to regulate the microwave dip.

Another aspect of the invention is the apparatus regulating the microwave signal power. In one embodiment, the microwave signal generating means include means generating an RF signal, a variable gain amplifier which amplifies the RF signal, and a frequency multiplier which generates the microwave signal from the amplified RF signal. The control means includes a microcontroller with the microwave frequency control means implemented by the microcontroller comprising means generating a digital power control signal which drives the microwave dip to a selected value. The control means further includes a digital-to-analog converter converting the digital power signal to an analog gain signal which is applied to the variable gain amplifier to regulate the amplified RF signal and therefore the power of the microwave signal. Preferably, the frequency multiplier is a step-recovery diode.

Alternatively, the means generating the microwave signal includes means generating an RF signal, and frequency multiplier means generating the microwave signal from the RF signal and having its power controlled by an analog bias signal. The microwave frequency control means is implemented by means generating a digital power control signal and the control means further includes a digital-to-analog converter which converts the digital power control signal to the analog bias signal.

In yet another embodiment of the invention, the microwave signal generating means comprises a clock generating a digital clock signal and direct digital synthesizer generating a microwave signal from the clock signal and digital frequency control signals. Again, the control means comprises a microcontroller and the means alternately adjusting the microwave signal comprises means generating the digital frequency control signals to alternately adjust the microwave signal to (i) produce maximum absorption of the microwave signal by the active medium and (ii) substantially no absorption of the microwave signal. More particularly, the means generating the digital frequency control signals comprises means generating a first digital frequency control signal regulated to drive the microwave signal to an atomic transition frequency of the medium, and a second digital frequency control signal which produces an offset from the atomic transition frequency in the microwave signal and which has an alternating positive and negative first value to produce dither in the microwave signal around the atomic transition frequency, and has a second value substantially larger than the first value to produce substantially no absorption of the microwave signal. The direct digital synthesizer includes digital means generating a time standard signal from the clock signal and a third digital frequency control signal which is generated by the means generating the digital frequency control signals as a predetermined function of the first digital control signal which is regulated to the atomic transition frequency of the active medium.

In yet another embodiment, the means generating the microwave signal comprises a voltage controlled oscillator generating the RF signal and controlled by an analog voltage signal, a first digital-to-analog converter generating the analog voltage signal from a first digital frequency control signal, a phase modulator modulating the RF signal phase as a function of the analog modulation voltage to generate a phase/frequency modulated RF signal, a second digital-to-analog converter or digitally controlled analog circuit generating the analog modulation voltage from a second digital frequency control signal, and frequency multiplier means generating the microwave signal from the modulated RF signal. The control means comprises a microcontroller which implements the means alternately adjusting the microwave signal which in turn generates the first digital frequency control signal regulated to drive the microwave signal to the atomic transition frequency of the active medium and generating the second digital frequency control signal having an alternating positive and negative first value to produce dither in the microwave signal and a second value substantially larger than the first value to produce substantially no absorption of the microwave signal. Preferably, the second value of the second digital frequency control signal is selected to offset the microwave frequency from the minimum dip frequency at least about twice the half-width of the absorption dip, and is alternately positive and negative.

BRIEF DESCRIPTION OF THE DRAWINGS

A full understanding of the invention can be gained from the following description of the preferred embodiments when read in conjunction with the accompanying drawings in which.

DESCRIPTION OF THE PREFERRED EMBODIMENT

Figure 1:
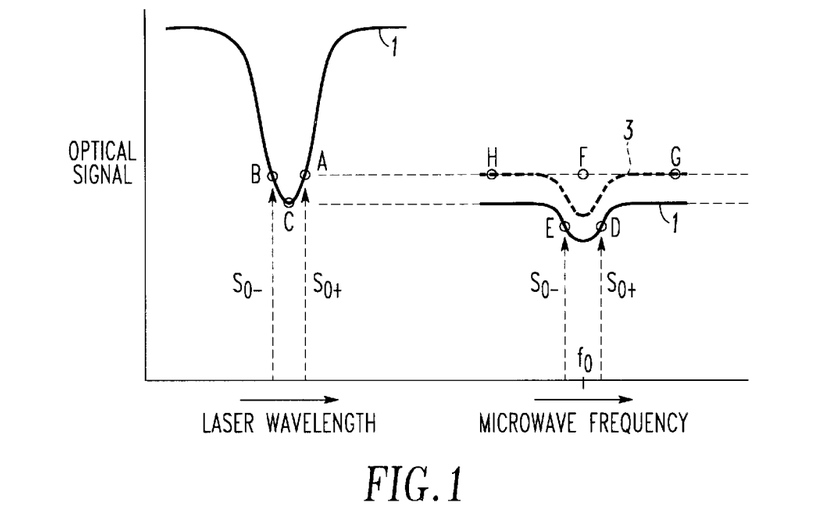
FIG. 1 illustrates the effect of the laser wavelength and microwave frequency on the optical signal generated by a cell type atomic clock.

In the cell-type atomic clock, a light beam passed through an active medium such as vapor of Cesium or Rubidium pumps the atoms of the active medium from the ground state to a higher state from which they fall to a state which is at a hyperfine wavelength above the ground state. Absorption of the light in pumping the vapor atoms to the higher state is detected by a photodetector. When the ground state becomes depleted, the light passing through the vapor to the detector increases. However, with the microwave signal tuned to the hyperfine wavelength, the ground state is repopulated, so that additional light is absorbed in pumping the vapor atoms. Thus, the response of the detector to the light signal exhibits a dip at the exact wavelength at which the vapor atoms are pumped to the higher state. The microwave frequency must also be at the precise hyperfine frequency to produce the maximum absorption of the light, and therefore, the minimum detector signal. These effects on the photodetector signal are illustrated in FIG. 1 where the optical signal 1 transmitted through the cell is represented as a function of the wavelength of the light, in this case, light produced by a laser, on the left part of the trace, and as a function of the microwave frequency on the right part. The stability of the clock relies on the constancy of the center frequency $f_o$ of this transition. In cell type clocks, this frequency is sensitive to various parameters, including the strength of the microwave field used to probe the transition. The present invention is directed to the method and apparatus for monitoring the strength of this microwave field, and using feedback control to stabilize it. While the invention is described in connection with an atomic clock employing a laser diode for the optical pumping, the invention is not limited to cell type atomic clocks with a laser diode light source.

The cell-type atomic clock of the invention is controlled by a microcontroller which operates serially. Consequently, the various control functions must be performed sequentially, with the sequence being performed repetitively at a prescribed rate. The set of control functions making up a complete cycle is referred to as a "frame." Frames are nominally identical. The time required to execute a frame is referred to as the "frame time" and division of the time within a frame to allow the performance of multiple tasks is often referred to as "time division multiplexing." In the following description, it is initially assumed for simplicity that within a frame each control function is performed once. The technique described can equally well be applied to more complicated sequences where some control functions are performed more than once within a frame, depending on the relative needs. Such an example is given below where frequency modulation implemented by phase modulation is discussed.

The output signal from an atomic clock is typically at a lower frequency than is needed for probing the atomic transition. The probe frequency is usually coupled to the output frequency via one or more phase-locked-loops. During that part of the frame devoted to stabilizing the frequency, the laser wavelength is held constant at the center of the optical absorption dip. In the absence of tuned microwave power, this would correspond to the point C in FIG. 1. Applying the microwave power and sweeping its frequency through the microwave resonance will generate the solid line curve 1 shown to the right in FIG. 1. Severe constraints apply to the microwave signal applied to the microwave resonator containing the cell for the purpose of probing the center frequency of the microwave transition. The frequency must be "dithered" equally between the steep sides of the absorption dip, represented by the points D and E in FIG. 1, and the power must be constant at a level sufficient to cause a measurable "dip." The optical signals recorded during this period are $S_+$ and $S_-$. The difference between these two measurements provides an error signal indicating the magnitude and direction of the offset between the center frequency of the applied signal and the center frequency of the transition. Typically, this error signal is fed back to the master VCXO in order to correct its frequency.

The remainder of each frame is devoted to tasks other than controlling the frequency. Of primary importance is the need to stabilize the laser wavelength, and to this end its wavelength is dithered equally from the center wavelength, corresponding to the points A and B in FIG. 1. The error signal given by the difference between transmitted optical signals measured at these wavelengths, $S_{o+}$ and $S_{o-}$, is fed back to the laser current controller to minimize this error. With the laser at either of these operating points, if the microwave power were maintained at its normal value and swept through the resonance, the broken curve 3 found to the right in FIG. 1 would be obtained. The base line for this dip is higher than that of the solid line curve by an amount equal to the difference between points A or B and C.

During this part of a frame, the control voltage of the master VCXO is frozen at a value derived from preceding measurements, and the normal constraints on the microwave signal fed to the resonator no longer apply. The frequency of the microwave signal can be, for example, offset by an amount sufficient to detune it from the resonance, represented by point G or H in FIG. 1. This approach is feasible if the architecture allows the microwave frequency to be offset without offsetting the master VCXO. When this is not possible, the microwave power fed to the resonator can be reduced to essentially zero instead, while keeping the VCXO at a frequency corresponding to the center frequency value $f_o$. This corresponds to the point F in FIG. 1. In either case, the resulting signals, $S_{o+}$ and $S_{o-}$, in addition to providing the error signal for controlling the laser wavelength, also provide a measure of the baseline of the microwave dip. The difference between the average of $S_{o+}$ and $S_{o-}$, and the average of $S_+$ and $S_-$, is a measure of the depth of the microwave dip. The use of averages largely eliminates potential errors in a dip measurement due to offsets in laser wavelength or the microwave frequency, since these have equal and opposite effects on $S_{o+}$ and $S_{o-}$, and on $S_+$ and $S_-$, respectively.

This measure of the depth of the microwave dip, based on differences in the transmitted optical signal, is a good measure of the microwave field strength provided the magnitudes of the signals $S_{o+}$ and $S_{o-}$ are constant. This will be the case provided the optical power incident on the cell is constant, and provided the optical density of the cell is constant. Both quantities are feedback stabilized, keeping variations small. The effect of these small variations can be minimized by normalizing the measured dip depth to the average of $S_{o+}$ and $S_{o-}$, giving the fractional dip. The difference between the measured fractional dip and a prescribed target value provides an error signal for use in feedback control of the microwave power applied to the resonator during that part of the frame used to probe the microwave dip.

Figure 2A:
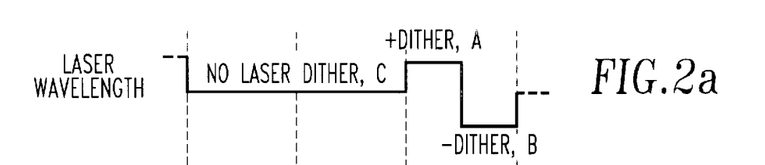
FIGS. 2a through 2e are waveform diagrams illustrating various control signals in a cell type atomic clock in accordance with several aspects of the invention.
Figures 2B, 2C:
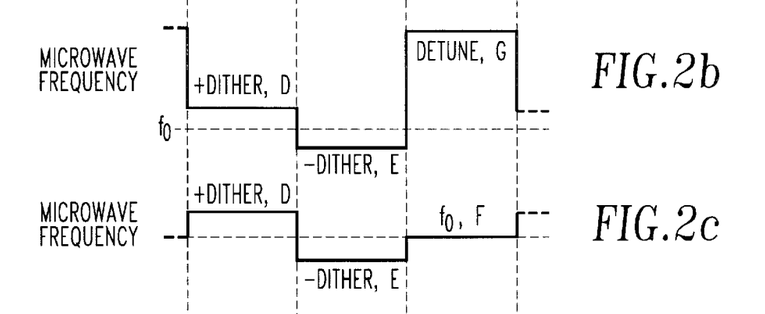
Figure 2D:
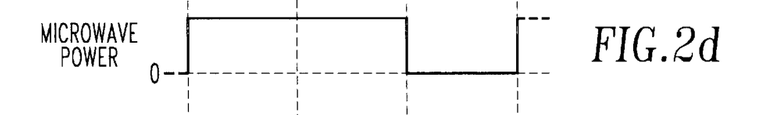
Figure 2E:
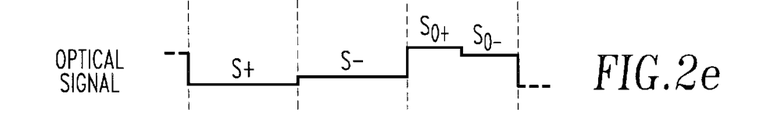

FIGS. 2a through 2e show an example where the first two thirds of each frame are devoted to probing the microwave resonance, in order to correct the operating frequency of the master VCXO, and the remaining third is devoted to probing the optical resonance, in order to correct the laser wavelength. In all cases time is the abscissa, and one complete frame is shown. FIG. 2a illustrates the changes imposed on the laser wavelength. FIG. 2b illustrates the changes imposed on the microwave frequency in the case when its power is maintained at the normal level, and the dip baseline is measured by detuning. FIGS. 2c and 2d refer to the case where the microwave power is set to zero in order to measure the dip baseline, while the frequency is assumed held at the center frequency in order to minimize the perturbation of the master VCXO. FIG. 2e illustrates the changes in the transmitted optical signal resulting from the changes imposed on the laser wavelength, and on the microwave frequency and power, during the different parts of the frame. During the first two thirds of the frame the signal is relatively low, corresponding to points D and E in FIG. 1. The small difference between $S_+$ and $S_-$ indicates that the frequency is currently too low. During the final third of the frame the signals $S_{o+}$ and $S_{o-}$ correspond to points A and B, and F or G, in FIG. 1. The small difference between them indicates that the laser wavelength is too high. The effect of these small differences, and of small variations in the general magnitude of the signals, is minimized by computing the fractional dip amplitude, FDA from $$FDA = (S_{o+} + S_{o-} - S_+ - S_-)/(S_{o+} + S_{o-}) \qquad \text{Eq. (1)}$$

For purposes of controlling the frequency we need to also measure $(S_+ - S_-)$, and for controlling the laser wavelength we need to measure $(S_{o+} - S_{o-})$.

In order to implement the disclosed scheme, it is necessary to be able to evaluate Eq.(1) with sufficient accuracy, and to be able to adequately modulate both the microwave power and frequency.

Figure 3:
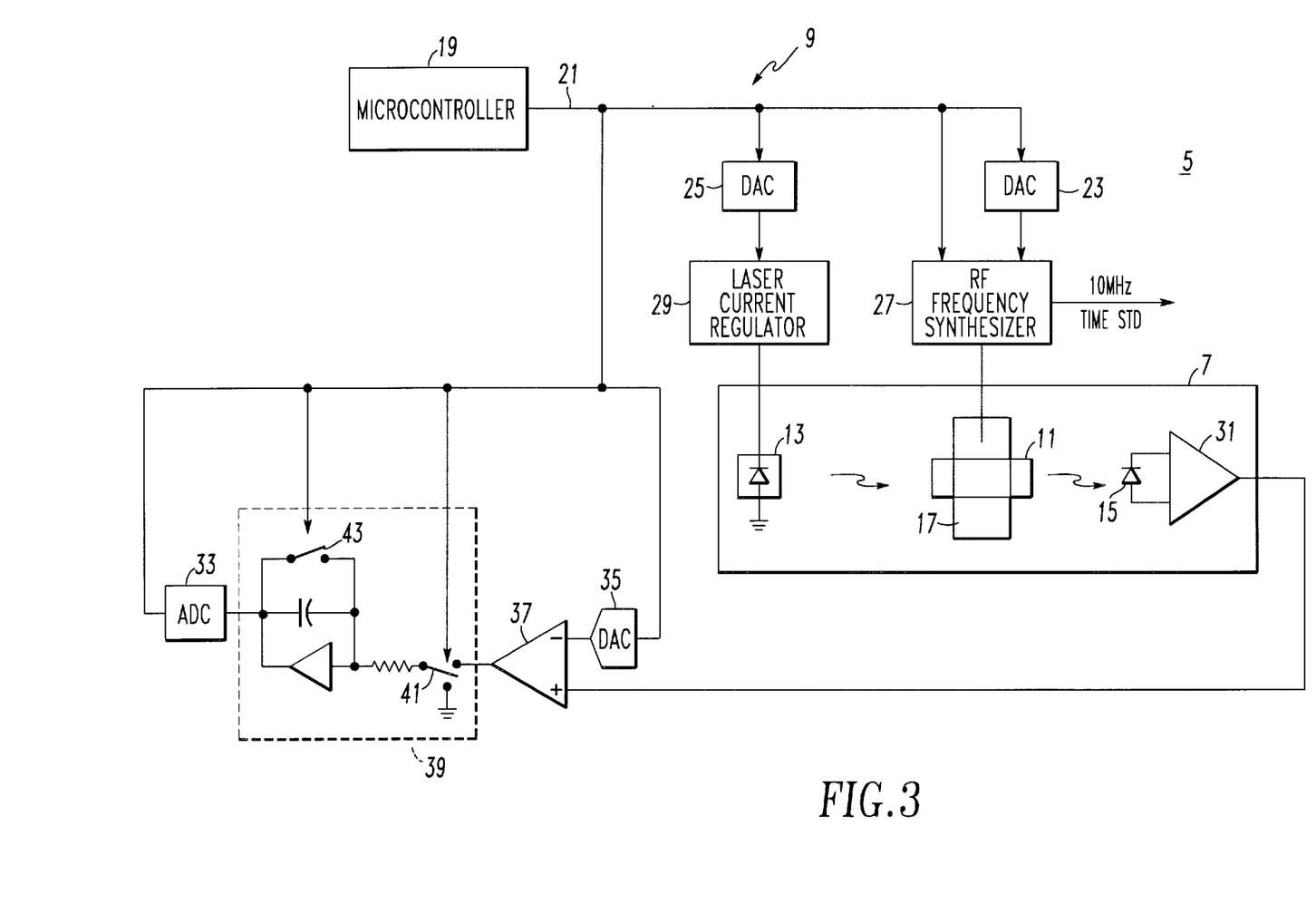
FIG. 3 is a schematic diagram mostly in block form of a cell type atomic clock in accordance with the invention.

A cell type atomic clock 5 to which the invention has been applied is illustrated in FIG. 3. This is a miniature microcontroller based atomic clock of the basic type illustrated in U.S. Pat. No. 5,606,291 which is hereby incorporated by reference. The atomic clock 5 includes a physics package 7 and control circuitry 9. The physics package 7 includes a miniature Cesium cell 11 such as that described in U.S. Pat. No. 5,192,921, which is also hereby incorporated by reference. A laser diode 13 generates a beam of coherent light which pumps the Cesium vapor in the cell 11. Absorption of the light by the Cesium vapor is detected by a photodetector 15. The microwave signal is coupled to the Cesium vapor by a microwave cavity 17, in which the vapor cell 11 is mounted. As mentioned, the microwave signal is tuned to the microwave atomic transition frequency of the Cesium vapor so that the ground state of the vapor is repopulated and the laser diode continuously pumps the Cesium atoms. In order to generate the required vapor pressure in the cell 11 and for stable operation, the vapor is heated in a manner discussed in U.S. Pat. No. 5,606,291. For stable operation, the temperature of the laser diode 13 is also controlled in a manner discussed in that patent. The physics package also includes a coil (not shown) for generating a uniform magnetic field, as also described in U.S. Pat. No. 5,606,291.

The heart of the control circuitry 5 is a microcontroller 19 which governs the operation of the physics package 7 through digital control signals provided over a serial-peripheral-interface (SPI) bus 21 to digital-to-analog converters (DAC) 23 and 25 associated with an RF frequency synthesizer 27 and a laser current regulator 29. The RF frequency synthesizer 27 generates the microwave signal which is applied to the resonator 17 to generate the magnetic field coupled to the active medium in the cell 11. The RF frequency synthesizer 27 also generates the 10 MHZ time standard signal which is the output of the atomic clock 5. The laser current regulator 29 controls the wavelength of the light generated by the laser diode 13.

The use of the microcontroller 19 requires that the optical signal generated by the photo diode 15 be converted from analog form, typically the output voltage from a transimpedance amplifier 31, to digital information. Digital values for the individual quantities appearing in Eq.(1) can be generated by feeding the incoming voltage signal directly to an analog-to-digital converter (ADC) 33 and the various differences of interest can be computed numerically by the microcontroller 19. However, the primary interest is in the quantities $(S_{o+} - S_{o-})$ and $(S_+ - S_-)$, and these quantities can be measured with much greater resolution if the incoming voltage signal is referred to an offset voltage held at a preset value close to that expected for the incoming values of $S_{o+}$ and $S_{o-}$, while these quantities are being measured. Similarly, when $S_+$ and $S_-$ are being measured, the offset voltage is held at a preset value expected to be close to their values. Such an arrangement is shown in FIG. 3. These two offset voltages are supplied from a digital-to-analog converter (DAC) 35, and determined by two settings stored and regularly updated in the microcontroller 19, based on recent measurements. These offset voltages are subtracted from the photodetector signal in a difference amplifier 37. The resultant signal is integrated by a signal integrator 39 which is reset between measurements by the switches 41 and 43.

One approach to updating the offset voltages provided through the DAC 35 is to adjust these settings from frame to frame in a manner which seeks to minimize the average voltages generated by the analog signal integrator 39. One of these settings corresponds to the denominator of Eq.(1), while the difference between them corresponds to the numerator. This approach has the advantage that the resulting value for FDA is immune to changes in analog gains involved in the photodetector 15, its preamplifier 31, and in the signal integrator 39. The resolution with which the FDA is determined is, however, limited by the resolution of the DAC 35 used to generate the offset voltages.

A variant of this approach, capable of measuring the dip with greater resolution, is to maintain the offset DAC 35 at the same setting throughout each frame, at a value appropriate to matching the signal expected during the measurement of $S_+$ and $S_-$. The voltages generated by the analog signal integrator 39 are then much larger during the period devoted to measuring $S_{o+}$ and $S_{o-}$. The denominator of Eq.(1) is given by an appropriate sum of the offset DAC's setting and the analog signal integrator outputs generated during the period devoted to measuring $S_{o+}$ and $S_{o-}$. Consequently, the offset DAC 35 limits the resolution with which the denominator can be determined, but since this corresponds to a relatively large number, the effect on determining FDA is likely to be negligible. The numerator of Eq.(1) is now calculated from the four stored digital representations of the voltages generated by the analog signal integrator 39, and therefore is no longer dependent on the resolution of the DAC 35 supplying the offset voltage. The numerator is, however, dependent on the effective gain of the analog signal integrator 39, which is directly sensitive to any changes in the capacitor value, for example due to temperature or aging. For this reason the approach employing only the offset DAC settings, described in the preceding paragraph, is to be preferred provided the DAC 35 has adequate resolution. A 16 bit DAC is expected to be adequate.

A third approach to evaluating Eq.(1) would be to digitize the optical signal voltage directly, for example using the 16 bit ADC 33 shown to the left of FIG. 3. While this approach could provide adequate resolution, it does not perform any signal averaging equivalent to that provided by the analog integrator 39. Numerical averaging could perform this function with the ADC 33 recording multiple samples, but this imposes a significantly greater burden on the microcontroller 19. This approach, though viable, is considered the least attractive of the three discussed.

Figure 4:
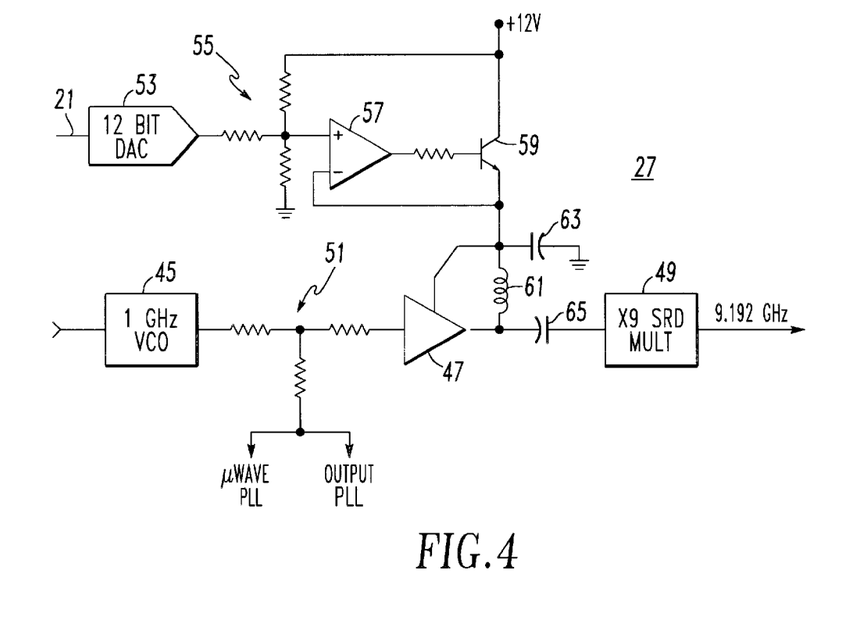
FIG. 4 is a schematic diagram of microwave power control using a step-recovery diode (SRD) drive adjustment achieved by controlling the supply voltage of the SRD driver amplifier.

Most cell type atomic clocks employ a step-recovery diode (SRD) as a frequency multiplier to generate the microwave frequency needed to probe the atomic transition. The power level can be controlled either by varying the amplitude of the RF signal driving the diode, or by actively biasing the diode and varying the degree of bias. An example of the former approach wherein the microwave power is controlled by adjusting the magnitude of the drive signal to an SRD through controls of supply voltage to an SRD driver amplifier is shown in FIG. 4. A voltage controlled oscillator (VCO) 45 is controlled, via a phase locked loop (not shown), by the frequency control signal generated by the microcontroller 19. The VCO 45 has a nominal output frequency of 1 GHz. As discussed, the microwave frequency control signal is digitally varied to dither the microwave signal. The output of the VCO is supplied to the SRD driver amplifier 47 which in turn drives the SRD multiplier 49 which multiplies the 1 GHz signal generated by the VCO 45 by 9 to generate the nominally 9.192 GHz microwave signal applied to the resonator 17. A power splitter formed by the resistor network 51 directs some of the output of the VCO 45 to the microwave phase-locked-loop and the output phase-locked-loop which generates the 10 MHz time standard signal. Both of these phase-locked-loops are described in U.S. Pat. No. 5,606,291.

The gain of the driver amplifier 47 is determined by a digital power control signal generated by the microcontroller 19 and transmitted over the serial bus 21 to a 12 bit digital-to-analog converter (DAC) 53. The DAC 53 generates a 0 to 5 volt power control signal. However, the driver amplifier 47 generates 0 output when its supply voltage is below 4 volts, and generates maximum output at 5 volts input. Therefore, a second resistor network 55 is provided to convert the 0 to 5 volt output of the 12 bit DAC 53 into a 4 to 5 volt signal. The operational amplifier 57 and transistor 59 form a current booster for the power supplied to the driver amplifier 47. A choke 61 blocks the 1 GHz SRD drive signal from getting into the power supply. In addition, the capacitor 63 shunts high frequency to ground. The capacitor 65 is a dc blocking capacitor which ac couples the driver amplifier 47 to the SRD multiplier 49.

Figure 5:
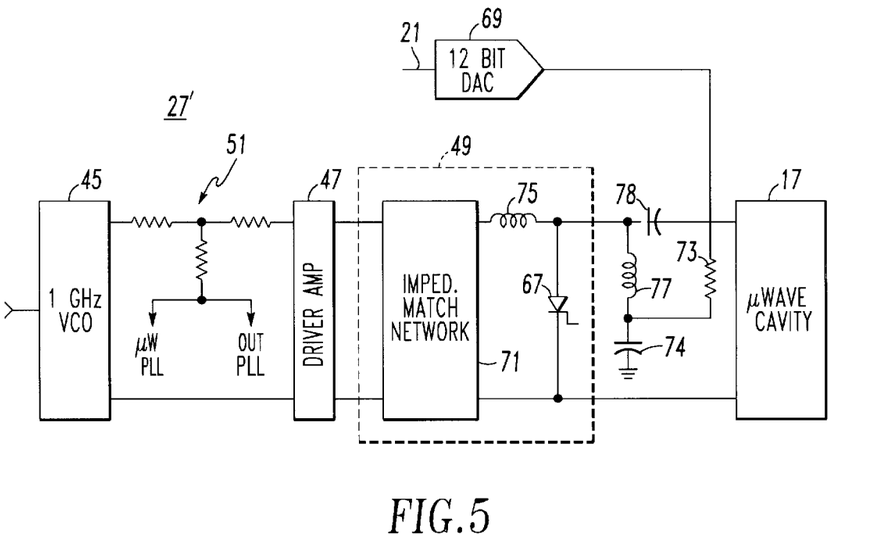
FIG. 5 is a schematic diagram of step recovery diode frequency multiplier with bias current control of its output power in accordance with another aspect of the invention.

FIG. 5 illustrates an example of an RF synthesizer 27' incorporating actively biased SRD 67, with a bias current similarly controlled by a DAC 69 interfaced to the microprocessor 19 through the SPI bus 21. The VCO 45 generates a signal having a frequency around 1 GHz. After the power splitter 51 diverts about half of the power to the microwave PLL and output PLL, the remaining power is applied to the SRD multiplier 49 through the driver amplifier 47. The unit 49 includes the SRD 67 and an impedance matching network 71. This matching network 71 matches the low SRD on-resistance of a few ohms to the, typically 50 ohms, of the driver amplifier 47, while maintaining dc isolation from ground. The analog power control signal produced by the DAC 69 is a 0 to 5 volt signal. A resistor 73 establishes the level of the current bias for the SRD 67. The capacitor 74 prevents high frequency signals from being fed back into the DAC 69. A voltage impulse, rich in high frequency harmonics of the input frequency and arising from the very large di/dt produced when the SRD 67 switches off is blocked by the choke 75 from being passed to the input. A second choke 77 presents a high impedance to the high frequency harmonics in the impulse and a low impedance to the dc bias current. Capacitor 78 ac couples the nominally 9.129 GHz output of SRD 67 to microwave cavity 17 (tuned load), but blocks the dc bias. This is needed because the cavity 17 has zero impedance at dc.

Figure 6:
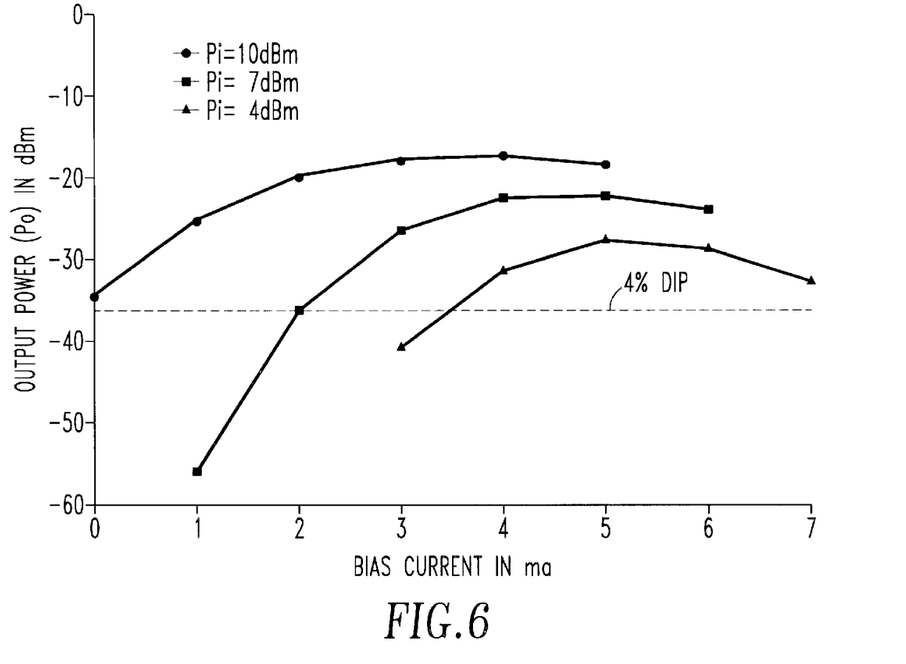
FIG. 6 is a plot of the output power of a step-recovery diode frequency multiplier versus bias current for three levels of input power.

FIG. 6 illustrates plots of output power versus bias current of SRD frequency multiplier with an input frequency of 1.0214 GHz and an output frequency of 9.1926 GHz for 3 values of input power. Using a recently designed physics package assembly, it was found that the microwave power level required to obtain a 4% microwave dip was −36 dBm. This value is shown in FIG. 6 and can be seen that the widest output power range, assuming power levels above and below −36 dBm are desired, comes about within an input power of +7 dBm and a bias current range of 1 to 4 milliampere.

This multiplier can be used to regulate the atomic clock microwave dip depth in the following manner. The microprocessor 19 contains a program implementing an algorithm which measures the actual microwave dip depth and then adjust the value of the bias voltage to increase or decrease the microwave power as required to achieve and maintain a specified dip depth. Such an algorithm will regulate the microwave dip depth against the variations in the physics package environment, frequency multiplier environment, and SRD input power level.

As mentioned above, the depth of the microwave dip is determined by adjusting the microwave signal, so that there is substantially no absorption of the signal. This can be accomplished by reducing the power of the microwave signal to substantially zero or detuning the frequency away from the maximum absorption frequency. In principal, whatever technique is used to dither the microwave frequency, can also be used to detune the frequency, provided it has the required range. In practice, this approach is applicable only when the architecture of the phase-locked-loops allows the microwave frequency to be controlled separately from the output frequency of the device. Examples of two such architectures are shown in FIGS. 7 and 8.

Figure 7:
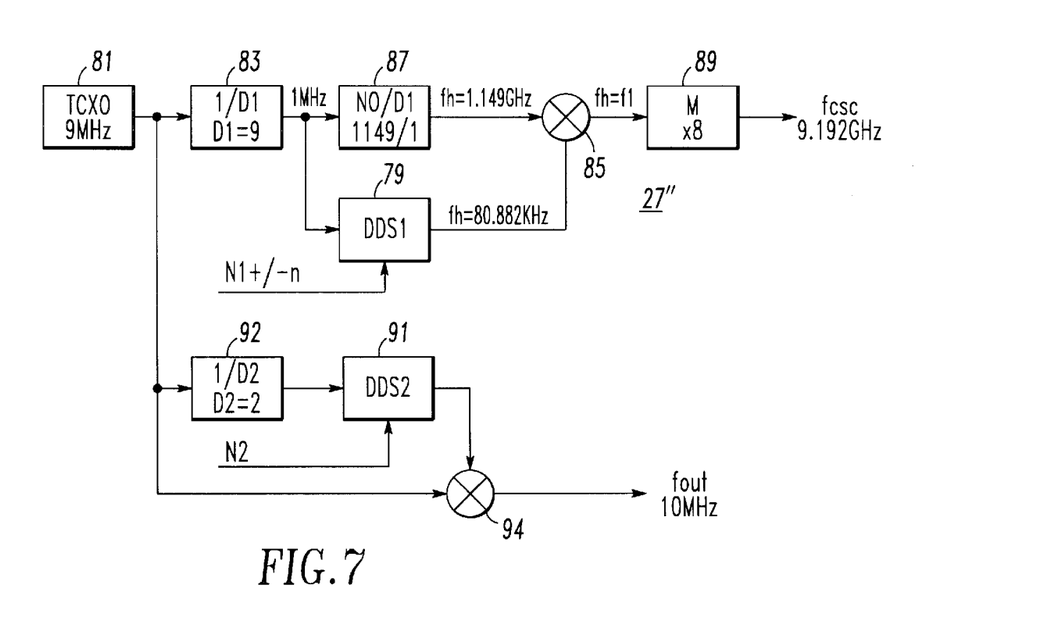
FIG. 7 is a schematic diagram of a microwave power control circuit using a direct-digital-synthesis (DDS) system.

In FIG. 7, there is shown an example of a frequency synthesizer 27" which does not utilize a master VCXO. The frequency of the probing microwave signal is controlled by a direct digital synthesizer (DDS1) 79 controlled by the microprocessor 19. DDS1 is clocked by a 1 MHz signal generated by an uncontrolled oscillator (TCXO) 81 and a divider 83. The digital information $\pm n$ supplied by the microprocessor 19 determines the dither amplitude, while $N_1$, steered by the results of the previous dither measurements, controls the center frequency. The output of DDS1 which is centered around 80.882 KHz is mixed in a single side band (SSB) mixer 85 with a 1.149 GHz signal generated from the 1 MHz clock signal by a phase-locked-loop 87. The output of the mixer 85 is the sum of the two input frequencies and is converted to the 9.192 GHz microwave probe signal by an SRD frequency multiplier 89. The value of n can be varied sufficiently to detune the microwave signal for dip depth control. Preferably, the value of n is adjusted to offset the microwave frequency from the center frequency, or minimum dip frequency, by at least about twice the half-width of the absorption dip. The stable output frequency of 10 MHz is separately generated by a second digital synthesizer (DDS2) 91 driven by the pulses from oscillator 81 divided down by divider 92, and similarly steered by the microprocessor 19 by input of the digital value $N_2$. The DDS2 91 generates a frequency which when added to the nominal 9 MHz signal from the oscillator 81 in a single side band mixer 94 produces the exact 10 MHz time standard output. Depending on the individual operating frequency of the cell, determined during initial setup, the relationship between $N_1$ and $N_2$ is fixed. Subsequent recalibration can be done by either adjusting the operating frequency of the cell to retrieve the original value, or by simply adjusting the relationship between $N_1$ and $N_2$. With this architecture, it is straightforward to extend the frame to include a detuning period by modifying the controlling information fed to the direct digital synthesizer DDS1, as illustrated in FIG. 2b.

Figure 8:
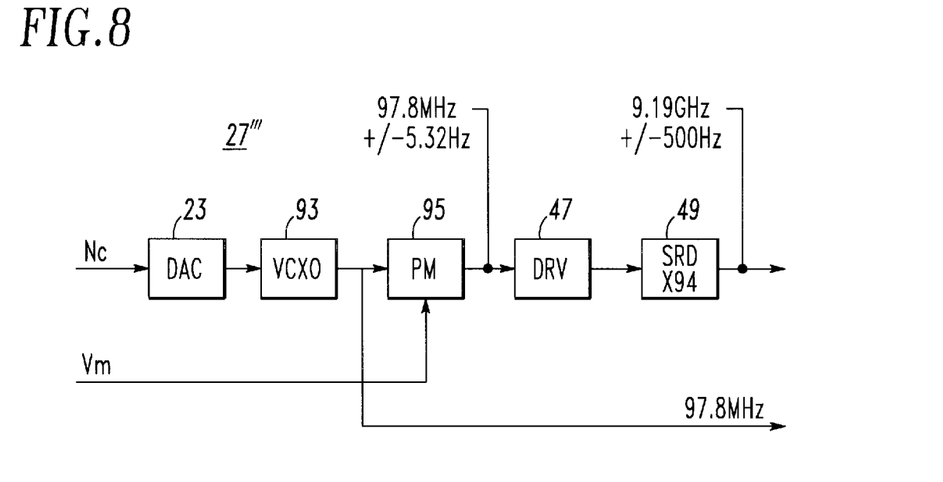
FIG. 8 is a schematic diagram of another microwave power control in which frequency modulation of the microwave signals is produced by applying a modulation voltage to a phase modulator.

FIG. 8 illustrates an example of a frequency synthesizer 27''' where the master VCXO 93 has no imposed frequency modulation, and its output is used in part, to provide the stable reference frequency output of the device, either directly or via a phase-locked-loop giving a correspondingly stable preferred frequency. In this example, frequency modulation is applied to the 97.8 MHz output of the VCXO 93 by a phase modulator (PM) 95 controlled by voltage $V_m$ which is supplied by the microcontroller 19 through a DAC or by means of a digitally controlled analog circuit (not shown). Normally, the only function of the phase modulator is to provide the dither of typically ±500 Hz at the output of the step recovery diode 49. It can also be used to implement the disclosed technique for measuring the microwave dip amplitude, by detuning the microwave from the dip. This would typically require a frequency offset of at least three times the dither offset, i.e., more than 1500 Hz in the example. For this purpose, it is necessary to employ a different phase modulator having a greater range than would be required for the dither alone, depending on the fraction of the frame time devoted to the different functions.

Figure 9:
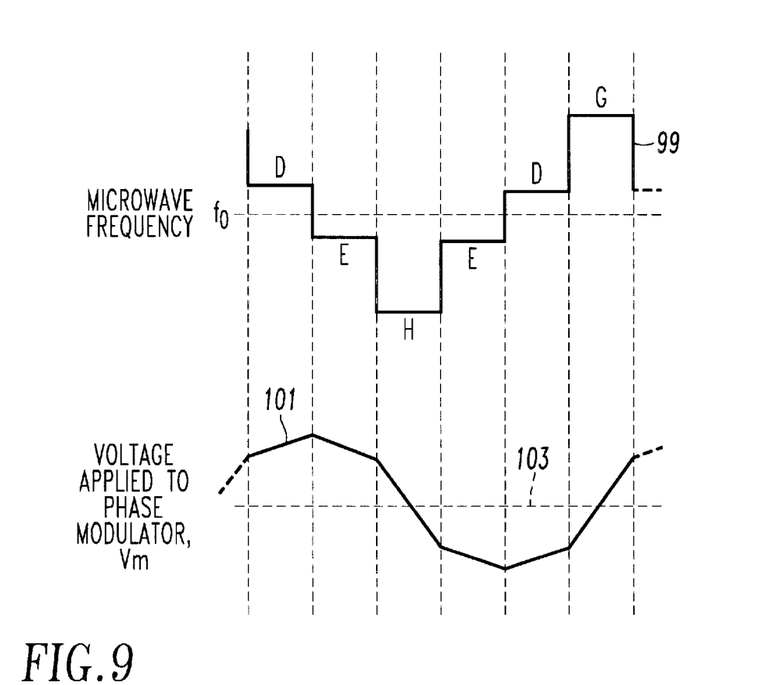
FIG. 9 is a waveform diagram illustrating detuning of the microwave frequency when the modulation is applied by a phase modulator.

When using a phase modulator for frequency modulation, it is necessary that the time averaged frequency excursion be zero. It follows that, in order for the VCXO frequency to be directly related to the center microwave frequency, $F_o$, and not be sensitive to the dither amplitude, the time average microwave frequency must be $f_o$. This is automatically the case for normal dithering, but would not be so for the example shown in FIG. 2b. To meet this constraint, we must alternate the sense of detuning, between points G and H in FIG. 1. Such a sequence is shown in FIG. 9, where the frame length has been doubled, and there are two measurements of the base line per frame, and similarly two pairs of dither sequences providing two measurements per frame of the center frequency offset from $f_o$. In order to minimize the individual frequency changes, we choose to alternately reverse the probing dither sequence, as indicated in FIG. 9. The trace 99 in FIG. 9 shows the variation of the microwave frequency, where it has been assumed that the points GH are four times as far from $f_o$ as the dither points D and E. The corresponding voltage waveform to be applied to the phase modulator is shown by the trace 101. The trace 103 represents the time average bias of the phase modulator.

For the example shown in FIG. 9, it has been assumed that the frequency is detuned for the same length of time as is spent on each side of the dither, with the frequency excursion being four times that of the dither. This results in a $V_m$ waveform amplitude six times that required for a normal dither sequence i.e., without a detuning period. Part of this increase results from choosing to alternate the dither sequence. Had the same sequence been repeated in each half of the frame, the $V_m$ waveform amplitude would have increased by a factor of five.

Figure 10:
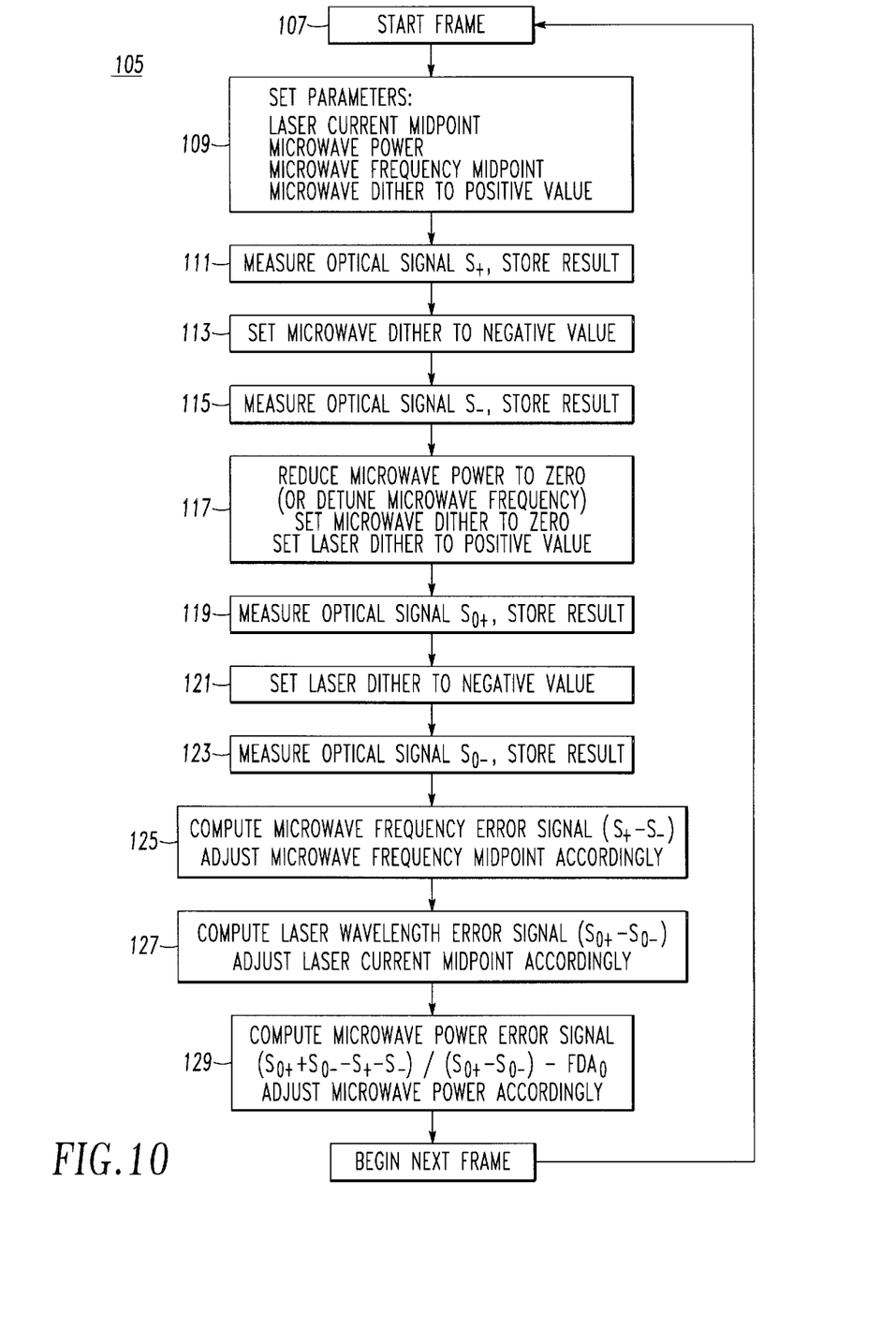
FIG. 10 is a flowchart of a program to implement the present invention.

A flow chart 105 for the program run by the microcontroller 19 to implement the invention is illustrated in FIG. 10. This routine is repetitively run for each frame of the control routine starting at 107. First, the laser current is set to the midpoint, the microwave power is set to the value determined in the previous frame, the microwave frequency is set to the calculated microwave transition frequency and the microwave dither is set to a positive value at 109. The resulting optical signal $S_+$ is recorded at 111. The microwave dither is then set to the negative value at 113 and the resultant optical signal S− is recorded at 115. Next, the microwave power is reduced to 0, or alternatively, the microwave frequency is detuned at 117. At this time, the microwave dither is set to 0 and the laser dither is set to a positive value. The optical signal So+ is measured and stored at 119. The laser dither is then set to a negative value at 121 and the resultant signal So− are stored at 123. Next, the microwave frequency error is calculated at 125 and is used to adjust the microwave frequency. Following this, the laser wavelength error signal is calculated and the laser current midpoint is adjusted accordingly at 127. Finally, the microwave power error signal is calculated in accordance with Equation 1 and is used to adjust the microwave power at 129.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of invention which is to be given the full breadth of the claims appended and any and all equivalents thereof.

What is claimed is:

1. A cell type atomic clock comprising:

a cell containing an active medium;

optical pumping means generating an optical signal which is passed through said cell to optically pump said active medium;

microwave means generating a microwave signal;

means coupling said microwave signal to said active medium;

means measuring the optical signal passed through said active medium as a measured optical signal;

control means comprising microwave frequency control means controlling said microwave signal generating means to adjust said microwave signal to produce a microwave dip in said measured optical signal, means calculating said microwave dip from said measured optical signal and means controlling said microwave signal generating means to adjust power of said microwave signal to regulate said microwave dip;

and wherein said microwave frequency control means comprises means alternately adjusting said microwave signal to produce maximum absorption of said microwave signal by said active medium, and substantially no absorption of said microwave signal by said active medium, and wherein said means calculating said microwave dip uses measurements of said measured optical signal when said microwave signal is adjusted to produce maximum absorption and when said microwave signal is adjusted to produce substantially no absorption to calculate said microwave dip.

2. The cell type atomic clock of claim 1 wherein said means alternately adjusting said microwave signal comprise means dithering said microwave signal about an atomic transition frequency of said active medium to produce said maximum absorption and wherein said control means further comprises means dithering said optical signal when said microwave signal is adjusted to produce substantially no absorption, and wherein said means calculating said microwave dip uses measurements of said measured optical signal when said optical signal is dithered and when said microwave signal is dithered to calculate said microwave dip.

3. The cell type atomic clock of claim 2 wherein said means calculating said microwave dip calculates a fractional value for said microwave dip as a difference between an average value of said measured optical signal when said optical signal is dithered and the average of said measured optical signal when said microwave signal is dithered, divided by the average value of said measured optical signal when said optical signal is dithered.

4. The cell type atomic clock of claim 2 wherein said means adjusting said microwave signal to produce substantially no absorption of the microwave signal comprises means setting said power of said microwave signal to substantially zero.

5. The cell type atomic clock of claim 2 wherein said means adjusting said microwave signal to produce substantially no absorption comprises means adjusting said microwave signal to a frequency which produces substantially no absorption.

6. The cell type atomic clock of claim 5 wherein said means dithering said microwave signal adjusts the frequency of said microwave signal alternately above and below said atomic transition frequency by a first frequency, and wherein said means adjusting said microwave signal to a frequency which produces substantially no absorption adjusts said microwave signal to a frequency which differs from said atomic transition frequency by at least about twice the half-width of the absorption dip.

7. The cell type atomic clock of claim 6 wherein said means which adjust said microwave signal to a frequency which produces substantially no absorption, alternately adjusts said microwave signal to frequencies equally above and below said atomic transition frequency.

8. The cell type atomic clock of claim 5 wherein said means which adjust said microwave signal to a frequency which produces substantially no absorption, alternately adjusts said microwave signal to frequencies equally above and below said atomic transition frequency.

9. The cell type atomic clock of claim 1 wherein said microwave signal generating means comprises means generating an RF signal, a variable gain amplifier which amplifies said RF signal to generate an amplified RF signal, and a frequency multiplier which generates said microwave signal from said amplified RF signal, and wherein said control means comprises a microcontroller, and said microwave frequency control means comprises means generating a digital power control signal which drives said microwave dip to a selected value, said control means further including a digital-to-analog converter converting said digital power control signal to an analog gain signal which is applied to said variable gain amplifier to regulate said amplified RF signal and, therefore, said power of said microwave signal.

10. The cell type atomic clock of claim 9 wherein said frequency multiplier is a step-recovery diode.

11. The cell type atomic clock of claim 1 wherein said microwave signal generating means comprises means generating an RF signal, and frequency multiplier means generating said microwave signal from said RF signal at a power controlled by an analog bias signal, and wherein said control means comprises a microcontroller and said microwave frequency control means comprises means generating a digital power control signal for driving said microwave dip to a selected value, said control means further including a digital-to-analog converter which converts said digital power control signal to said analog bias signal.

12. The cell type atomic clock of claim 11 wherein said frequency multiplier comprises a step-recovery diode.

13. The cell type atomic clock of claim 1 wherein said microwave signal generating means comprises a clock generating a digital clock signal and a direct digital synthesizer generating said microwave signal from said digital clock signal and digital frequency control signals, and wherein said control means comprises a microcontroller and said means alternately adjusting said microwave signal comprises means generating said digital frequency control signals to alternately adjust said microwave signal to produce maximum absorption of said microwave signal by said active medium and substantially no absorption of said microwave signal by said active medium.

14. The cell type atomic clock of claim 13 wherein said means generating said digital frequency control signals comprises means generating a first digital frequency control signal regulated to drive said microwave signal to an atomic transition frequency of said medium and a second digital frequency control signal which produces an offset from said atomic transition frequency in said microwave signal and which has an alternating positive and negative first value to produce dither in said microwave signal around said atomic transition frequency to produce said maximum absorption of said microwave signal, and has a second value substantially larger than said first value to produce substantially no absorption of said microwave signal.

15. The cell type atomic clock of claim 14 wherein said means generating said second digital frequency control signal generates said second digital frequency control signal with a second value which produces a microwave frequency which is offset at least about twice the half-width of the absorption dip and which is alternately positive and negative.

16. The cell type atomic clock of claim 14 wherein said direct digital synthesizer includes digital means generating a time standard signal from said clock signal and a third digital frequency control signal, and wherein said means generating said digital frequency control signals generates said third digital frequency control signal as a predetermined function of said first digital frequency control signal which is regulated to said atomic transition frequency of said active medium.

17. The cell type atomic clock of claim 1 wherein said microwave signal generating means comprises:

a voltage controlled oscillator generating a RF signal from an analog voltage signal, a first digital-to-analog converter generating said analog voltage signal from a first digital frequency control signal, a phase modulator modulating said RF signal as a function of an analog modulation voltage to generate a modulated RF signal, a second digital-to-analog converter generating said analog modulation voltage from a second digital frequency control signal, and frequency multiplier means generating said microwave signal from said modulated RF signal, and wherein said control means comprises a microcontroller and said means alternately adjusting said microwave signal, comprises means generating said first digital frequency control signal regulated to drive said microwave signal to an atomic transition frequency of said active medium and generating said second digital frequency control signal having an alternating positive and negative first value to produce dither in said microwave signal around said atomic transition frequency to produce said maximum absorption of said microwave signal, and has a second value substantially larger than said first value to produce said substantially no absorption of said microwave signal.

18. The cell type atomic clock of claim 17 wherein said means generating said second digital frequency control signal generates said second digital frequency control signal with a second value which produces a microwave frequency which is offset from dip minimum at least about twice the half-width of the adsorption dip and which is alternately positive and negative.

19. The cell type atomic clock of claim 17 wherein said microwave signal generating means includes means generating a time standard signal from said RF signal generated by said voltage controlled oscillator.

20. A method of stabilizing microwave field intensity in a cell type atomic clock in which an active medium contained in a cell is optically pumped by an optical signal passed through the active medium, said method comprising:

(a) during a first interval applying a microwave signal to a resonator to generate a microwave field coupled to said active medium in said cell, said microwave signal being dithered around a frequency which produces maximum absorption of said microwave signal by said active medium;

(b) generating first measurements of said optical signal passed through said active medium during said first interval;

(c) during a second interval, adjusting said microwave signal so that there is substantially no absorption of said microwave signal by said active medium and dithering said optical signal;

(d) generating second measurements of said optical signal passed through said active medium during said second interval;

(e) sequentially repeating steps (a) through (d); and controlling power of said microwave signal to maintain a specified relationship between said first and second measurements.

21. The method of claim 20 wherein said step of adjusting said microwave signal during said second interval comprises reducing power of said microwave signal substantially to zero.

22. The method of claim 20 wherein said step of adjusting said microwave signal during said second interval comprises adjusting frequency of said microwave signal to a frequency at which there is substantially no absorption of said microwave signal by said active medium during said second interval.

23. The method of claim 22 wherein said step of adjusting said frequency of said microwave signal comprises increasing and decreasing the frequency of said microwave signal an equal amount from said frequency which produces maximum absorption of said microwave signal on alternate of said second intervals to frequencies at which there is substantially no absorption of said microwave signal.

24. The method of claim 20 wherein said step (b) includes dithering said optical signal around an optical wavelength of said active medium and wherein said step of controlling power includes calculating a fractional value of microwave dip as a difference between an average value of the measured optical signal when said optical signal is dithered during said second intervals and an average of said measured optical signal when said microwave signal is dithered during said first intervals with said difference divided by said average of said measured optical signal when said optical signal is dithered.

* * * * *